(12) United States Patent
Hase et al.

(10) Patent No.: US 6,753,604 B1
(45) Date of Patent: Jun. 22, 2004

(54) HIGH FREQUENCY CIRCUIT MODULE AND COMMUNICATION DEVICE

(75) Inventors: Eiichi Hase, Iruma (JP); Shun Imai, Komoro (JP)

(73) Assignee: Renesas Technology Corp., Tokyo (JP)

( * ) Notice: Subject to any disclaimer, the term of this patent is extended or adjusted under 35 U.S.C. 154(b) by 234 days.

(21) Appl. No.: 09/637,574

(22) Filed: Aug. 14, 2000

(30) Foreign Application Priority Data

Sep. 29, 1999 (JP) .......................................... 11-275730

(51) Int. Cl.⁷ .............................................. H01L 23/34
(52) U.S. Cl. ....................... 257/728; 257/664; 257/760; 333/247
(58) Field of Search ................................. 257/347, 664, 257/728, 760; 333/247

(56) References Cited

U.S. PATENT DOCUMENTS

| | | | |
|---|---|---|---|
| 4,890,155 A | * 12/1989 | Miyagawa et al. | ............ 357/74 |
| 5,387,888 A | * 2/1995 | Eda et al. | .................... 333/247 |
| 5,510,758 A | * 4/1996 | Fujita et al. | ................. 333/247 |
| 5,554,960 A | * 9/1996 | Ohnuki et al. | ............... 333/132 |
| 6,335,669 B1 | * 1/2002 | Miyazaki et al. | ........... 333/247 |

FOREIGN PATENT DOCUMENTS

| | | | |
|---|---|---|---|
| EP | 840 443 | * | 5/1998 |
| JP | 10-013163 | | 1/1998 |
| JP | 2000-209006 | * | 7/2000 |

OTHER PUBLICATIONS

T. Ichioka et al, "A Power Amplifier Using Single Layer Alumina Substrate with Thin–Film Resistors and Capacitors for North American Digital Cellular Phone System", Proceedings of the 1996 Institute IEIC Spring Conference, No. C–86, 1996, p. 86.

N. Ogata et al, "1.9GHz RF Front–End Module Using a Ceramics Substrate", Proceedings of the 1997 Institute IEIC Conference—Electronics Society, No. C–2–14, 1997, p. 49.

* cited by examiner

*Primary Examiner*—Nathan J. Flynn
*Assistant Examiner*—Ahmed N. Sefer
(74) *Attorney, Agent, or Firm*—Mattingly, Stanger & Malur, P.C.

(57) ABSTRACT

The present invention relates to a high frequency circuit module in which a two or more layer dielectric substrate is used. The dielectric substrate provided between a conductor line of a matching circuit on the input side or on the output side and a metal ground is composed of two or more layers. Since a required part can be increased in thickness without changing the thickness of the whole dielectric substrate, the transmission loss can be reduced and the miniaturization of the high frequency circuit module and the communication device using the same can be realized.

18 Claims, 11 Drawing Sheets

HIGH FREQUENCY CIRCUIT MODULE AND COMMUNICATION DEVICE

BACKGROUND OF THE INVENTION

1. Field of the Invention

The present invention relates to a high frequency circuit module and a communication device such as a mobile wireless terminal and a pocket telephone employing the same.

2. Description of the Prior Art

The miniaturization and the enhancement of the efficiency of power of a high frequency circuit module used for a mobile wireless terminal, a pocket telephone and others in view of the mountability and talk time have been important objectives.

For a high frequency circuit module used for a communication device such as conventional type mobile wireless terminal and pocket telephone, the one using a single layer or multi-layer dielectric substrate is known.

An example of a high frequency circuit module using a single layer dielectric substrate is shown in the proceeding of the 1996 Institute IEIC Spring Conference C-86, "A Power Amplifier Using Single Layer Alumina Substrate with Thin-Film Resistors and Capacitors for North American Digital Phone System" (hereinafter called first conventional technique). According to the first conventional technique, a transmission line which is a distributed element, a lumped constant element such as a resistor, a capacitor and an inductor and a semiconductor element are formed on the same surface of a dielectric substrate to compose an input-output matching circuit and a power amplifier. A high frequency signal is transmitted to an external device by a high frequency signal electrode provided to the surface of the dielectric substrate. The earth electrode of the semiconductor element provided to the surface of the dielectric substrate and an earth electrode on the reverse side are connected via a through-hole.

Also, an example of a high frequency circuit module using a multi-layer (two-layer) dielectric substrate is shown in the proceeding of the 1997 Institute IEIC Conference Electronics Society C-2-14, "1.9 GHz RF Front-End Module Using a Ceramics Substrate" (hereinafter called second conventional technique). According to the second conventional technique, a transmission line which is a distributed constant element, an input-output matching circuit composed of a lumped constant element such as a resistor, a capacitor and an inductor and a semiconductor element are formed on the same surface of a dielectric substrate to compose a high frequency circuit module. A high frequency signal electrode provided to the surface of a first layer of the dielectric substrate and a high frequency signal electrode on the reverse side of a second layer are connected via wiring provided to the surface of the second layer through a through-hole. The earth electrode of the semiconductor element provided to the surface of the first layer of the dielectric substrate and an earth electrode on the reverse side are connected via a through-hole. The order of the layers of the dielectric substrate are counted as a first layer, a second layer, a third layer, etc., from the surface to the reverse side.

SUMMARY OF THE INVENTION

Referring to FIGS. 9 to 11, relationship between the miniaturization and the enhancement of the efficiency of power in the first conventional type technique will be described below.

FIG. 9 is a general schematic sectional view showing a transmission line formed on a single layer dielectric substrate. A conductor 43 on the surface, a dielectric substrate 44 and ground metal on the reverse side 45 forms a transmission line.

FIG. 10 shows calculated values of transmission loss at the frequency of 1.9 GHz when the relative dielectric constant of the dielectric substrate 44 is 8.1 and the thickness of the dielectric substrate 44 is varied from 0.1 mm to 3.0 mm. Curves 1 to 3 show cases in which the width of the conductor 43 forming a transmission line is respectively 0.1 mm, 0.2 mm and 0.5 mm. As clear from FIG. 10, in the cases of any width of the conductor 43, as the dielectric substrate 44 becomes thick, the transmission loss has a tendency to become small.

FIG. 11 shows calculated values of transmission loss at the frequency of 1.9 GHz when the relative inductivity of the dielectric substrate 44 is 8.1 and the width of the conductor 43 forming a transmission line is varied from 0.02 mm to 3.0 mm. Curves 1 to 3 show cases in which the thickness of the dielectric substrate 44 is respectively 0.15 mm, 0.3 mm and 0.6 mm. As clear from FIG. 11, in the cases of any thickness of the dielectric substrate 44, the transmission loss decreases as the conductor 43 forming a transmission line becomes wide, becomes minimum in a range in which the width of the conductor 43 is 0.3 to 0.7 mm and increases when the conductor 43 becomes wider.

As clear from the above description, to reduce transmission loss, it is required to thicken the dielectric substrate 44 and widen the conductor 43 and the miniaturization of the high frequency circuit module has a limit.

Next, referring to FIGS. 12 to 14, relationship between the miniaturization and the enhancement of the efficiency of power in the second conventional type technique will be described.

FIG. 12 is a general schematic sectional view showing a transmission line formed on a two-layer dielectric substrate. A conductor 46, a dielectric substrate 47, ground metal 48 on the reverse side and ground metal 49 on the surface forms a transmission line.

FIG. 13 shows calculated values of transmission loss at the frequency of 1.9 GHz when the relative dielectric constant of the dielectric substrate 47 is 8.1 and the thickness of the dielectric substrate 47 is varied from 0.1 mm to 3.0 mm. Curves 1 to 3 show cases in which the width of the conductor 46 forming a transmission line is respectively 0.1 mm, 0.2 mm and 0.5 mm. As clear from FIG. 13, in the cases of any width of the conductor 46, as the dielectric substrate 47 becomes thick, the transmission loss becomes small.

FIG. 14 shows calculated values of transmission loss at the frequency of 1.9 GHz when the relative inductivity of the dielectric substrate 47 is 8.1 and the width of the conductor 46 forming a transmission line is varied from 0.02 mm to 3.0 mm. Curves 1 to 3 show cases in which the thickness of the dielectric substrate 47 is respectively 0.15 mm, 0.3 mm and 0.6 mm. As clear from FIG. 14, in the cases of any thickness of the dielectric substrate 47, as the conductor 46 forming a transmission line becomes wide, the transmission loss has a tendency to become small.

As clear from the above description, to reduce transmission loss, it is required to thicken the dielectric substrate 47 and widen the conductor 46 and the miniaturization of the high frequency circuit module has a limit.

The object of this invention is to provide a high frequency circuit module which can be more miniaturized and a communication device using it.

To achieve the object, a high frequency circuit module according to this invention uses a two or more-layer dielectric substrate and the thickness of the dielectric substrate between a conductor forming the transmission line of a matching circuit on the side of input or output and ground metal is composed of two or more layers.

Specifically, to thicken a dielectric substrate that ranges between the conductor forming the transmission line of the matching circuit on the side of input or output and the ground metal, the ground metal provided to the dielectric substrate between them is formed in the shape in which a part is hollowed out so that a part opposite to the conductor is included.

As a required part can be thickened without varying the thickness of the whole dielectric substrate, the transmission loss can be reduced, and a high frequency circuit module and a communication device using it can be miniaturized.

The above-mentioned and others features and objects of this invention will become more apparent by reference to the following description taken in conjunction with the accompanying drawings.

DETAILED DESCRIPTION OF THE EMBODIMENTS

The present invention will be described in detail based upon embodiments below.

First Embodiment

Figure 1:
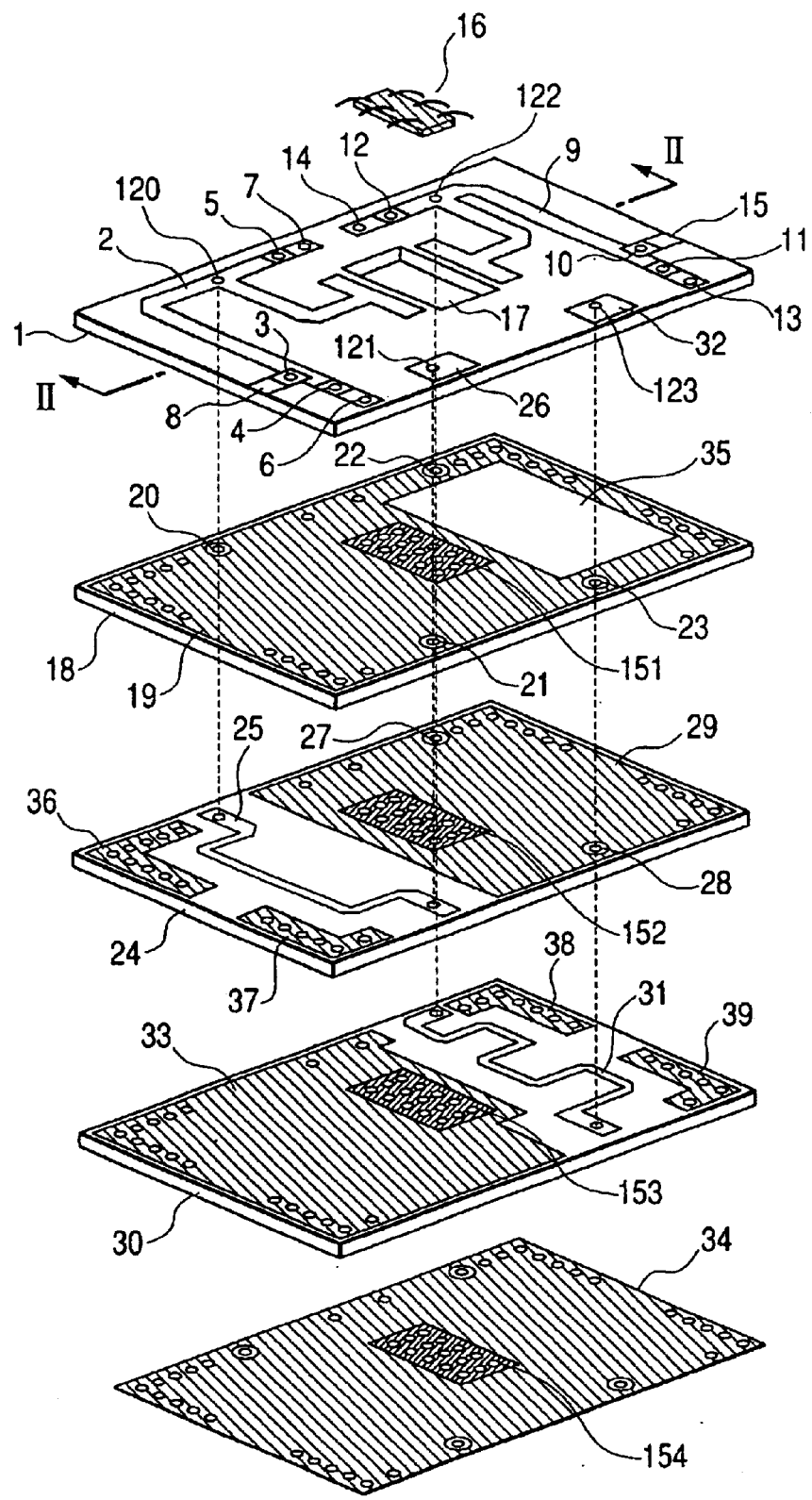
FIG. 1 is an exploded view showing a high frequency circuit module equivalent to a first embodiment of the invention.

FIG. 1 is an exploded view showing a high frequency circuit module equivalent to a first embodiment. On the surface of a first-layer dielectric substrate 1, a matching circuit on the input side composed of conductor line 2 and chip capacitors 3, 4 and 5 and a matching circuit on the output side composed of conductor line 9 and chip capacitors 10, 11 and 12 are formed. The chip capacitor 3 is connected to an input terminal 8, the chip capacitor 4 is connected to an earth terminal 6, the chip capacitor 5 is connected to an earth terminal 7, the chip capacitor 10 is connected to an output terminal 15, the chip capacitor 11 is connected to an earth terminal 13 and the chip capacitor 1 2 is connected to an earth terminal 14. Further, a through-hole 17 piercing the first-layer dielectric substrate 1 is provided to the dielectric substrate. A semiconductor chip 16 is bonded to ground metal 19 provided on a second-layer dielectric substrate 18 via the through-hole 17.

The conductor line 2 on the surface of the first-layer dielectric substrate 1 is connected to one end of conductor line 25 provided on the surface of a third-layer dielectric substrate 24 via a through-hole 120. provided to the first-layer dielectric substrate 1 and a through-hole 20 provided to the second-layer dielectric substrate 18. The other end of the line 25 is connected to a terminal 26 provided on the surface of the first-layer dielectric substrate 1 via a through-hole 21 provided to the second-layer dielectric substrate 18 and a through-hole 121 provided to the first-layer dielectric substrate 1.

Also, the conductor line 9 on the surface of the first-layer dielectric substrate 1 is connected to one end of a conductor line 31 provided on the surface of a fourth-layer dielectric substrate 30 via a through-hole 122 provided to the first-layer dielectric substrate 1, a through-hole 22 provided to the second-layer dielectric substrate 18 and a through-hole 27 provided to the third-layer dielectric substrate 24. The other end of the conductor line 31 is connected to a terminal 32 provided on the surface of the first-layer dielectric substrate 1 via a through-hole 28 provided to the third-layer dielectric substrate 24, a through-hole 23 provided to the second-layer dielectric substrate 18 and a through-hole 123 provided to the first-layer dielectric substrate 1.

The semiconductor chip 16 is bonded to the conductor lines 2 and 9 on the surface of the first-layer dielectric substrate 1. The ground metal 19 on the surface of the second-layer dielectric substrate 18 to which the semiconductor chip 16 is bonded is connected to ground metal 29 provided on the surface of the third-layer dielectric substrate 24, ground metal 33 provided on the surface of the fourth-layer dielectric substrate 30 and ground metal 34 provided on the reverse side of the fourth-layer dielectric substrate 30 via a through-hole 151 provided to the second-layer dielectric substrate 18, a through-hole 152 provided to the third-layer dielectric substrate 24, a through-hole 153 provided to the fourth-layer dielectric substrate 30 and a through-hole 154 provided to the ground metal 34 on the reverse side of the fourth-layer dielectric substrate 30. Each rectangular frame respectively surrounding the through-holes 151, 152, 153 and 154 shows an area where the semiconductor chip 16 is to be installed.

A part 35 of the ground metal 19 on the surface of the second-layer dielectric substrate 18 is removed so that a part opposite to the conductor line 9 of the matching circuit on the output side on the surface of the first-layer dielectric substrate 1 is included. The ground metal 19 is connected to the ground metal 29, 36 and 37 provided on the surface of the third-layer dielectric substrate 24, the ground metal 33, 38 and 39 provided on the surface of the fourth-layer dielectric substrate 30 and the ground metal 34 provided on the reverse side of the fourth-layer dielectric substrate 30 via through-holes (no reference number) provided in the periphery of the second-, third- and fourth-layer dielectric substrates 18, 24 and 30 and through-holes (no reference number) provided in the periphery of the ground metal 34 provided on the reverse side of the fourth-layer dielectric substrate 30.

In this embodiment, each ground metal and each through-hole are connected by forming each ground metal by copper and embodying copper in each through-hole.

In this embodiment, the first-layer dielectric substrate 1 and the second-layer dielectric substrate 18 continue between the conductor line 9 and the ground metal 29, and for the thickness between both, the thickness of the second-layer dielectric substrate 18 is added to that of the first-layer dielectric substrate 1. Therefore, the thickness between the conductor line 9 and the ground metal 29 can be thicker than the thickness of only the first-layer dielectric substrate 1 or the second-layer dielectric substrate 18 and the transmission loss can be reduced.

In this embodiment, the terminals 8 and 15 via which a high frequency signal is input/output and the terminals 26 and 32 via which voltage is applied to the semiconductor chip 16 are provided on the surface of the first-layer dielectric substrate 1, however, for example, a terminal via which a high frequency signal is input/output may be also provided on the surface of the first-layer dielectric substrate 1 and a terminal via which voltage is applied to the semiconductor chip 16 may be also provided on the reverse side of the fourth-layer dielectric substrate 30. Also, a terminal via which a high frequency signal is input/output and a terminal via which voltage is applied to the semiconductor chip 16 may be also provided on the reverse side of the fourth-layer dielectric substrate 30. And the number of terminals is also not particularly limited.

Figure 2:
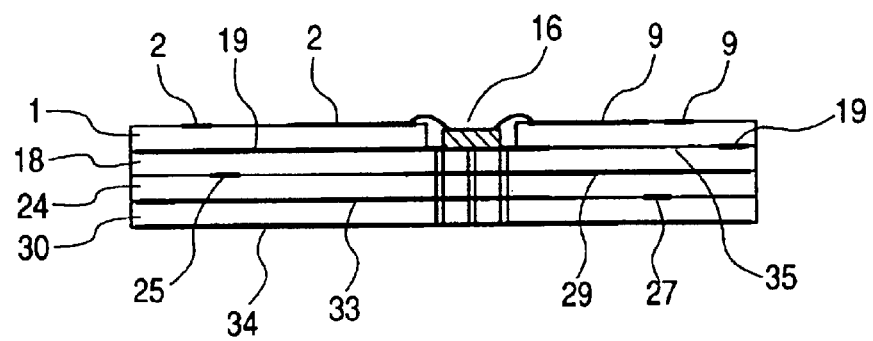
FIG. 2 is a sectional view showing the high frequency circuit module equivalent to the first embodiment of the invention.

FIG. 2 is a sectional view viewed along a line II—II in case the dielectric substrates shown in FIG. 1 are assembled. The dielectric substrate in the part 35 can be thicker than the first-layer dielectric substrate 1, the second-layer dielectric substrate 18, the third-layer dielectric substrate 24 and the fourth-layer dielectric substrate 30 by providing the part 35 formed by removing a part of the ground metal 19 on the surface of the second-layer dielectric substrate 18.

Figure 3:
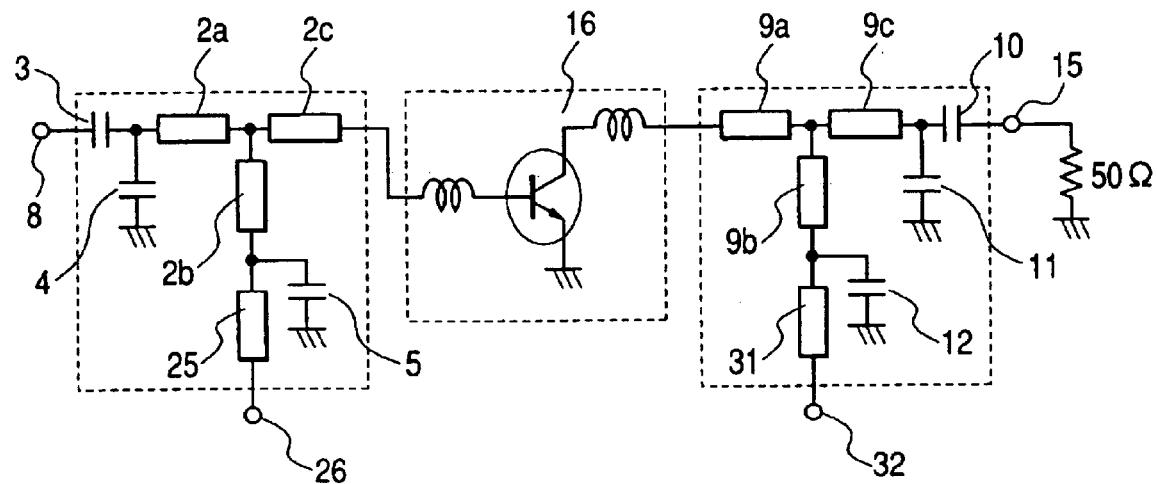
FIG. 3 shows an equivalent circuit as the whole amplifier of the high frequency circuit module equivalent to the first embodiment of the invention.

FIG. 3 shows an equivalent circuit of a single-stage amplifier of the high frequency circuit module shown in FIG. 1. It includes a matching circuit on the input side composed of the conductor line 2, chip capacitors 3, 4 and 5, a line 25 that applies power supply voltage to the semiconductor chip 16 including bonding wire, a power supply voltage terminal 26 and an input terminal 8 and a matching circuit on the output side composed of a conductor line 9, chip capacitors 10, 11 and 12, a line 31 that applies power supply voltage to the semiconductor chip 16 including bonding wire, a power supply voltage terminal 32 and an output terminal 15. The conductor line 2 is composed of a conductor lines 2a, 2b and 2c and the conductor line 9 is composed of conductor lines 9a, 9b and 9c.

Figure 4:
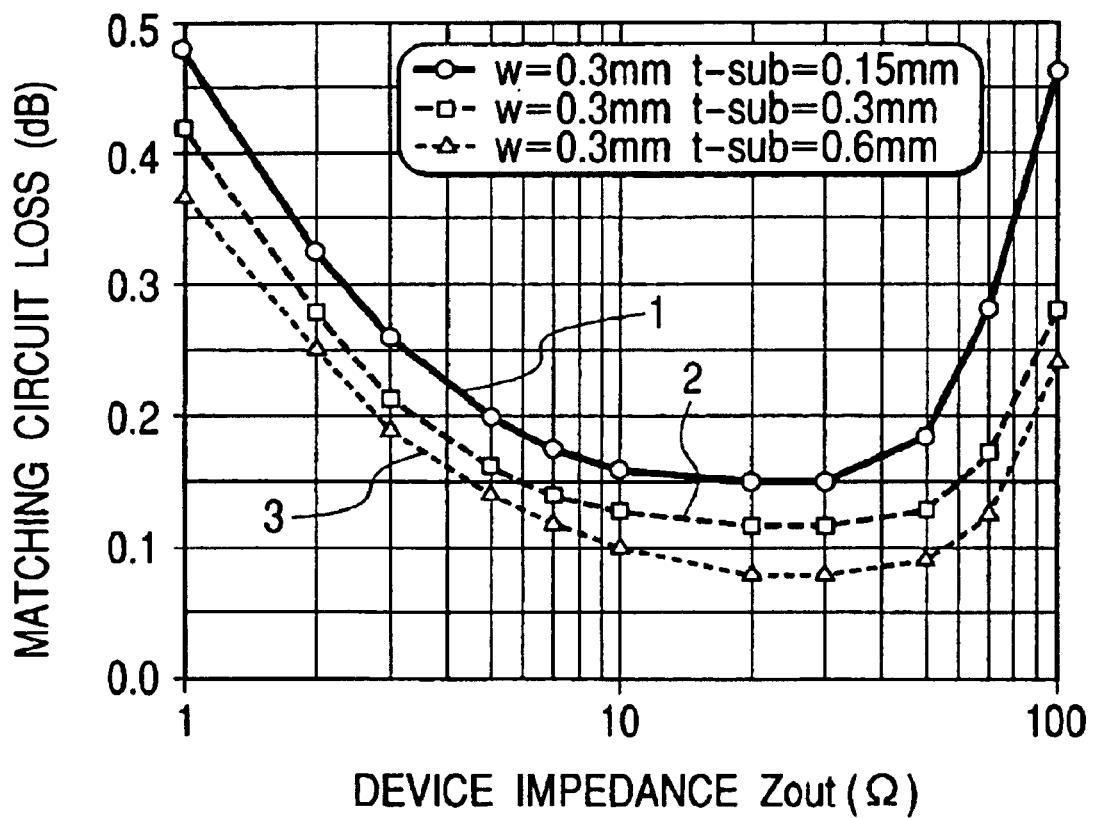
FIG. 4 shows calculated values of the loss of a matching circuit on the output side of a conventional high frequency circuit module.
Figure 9:
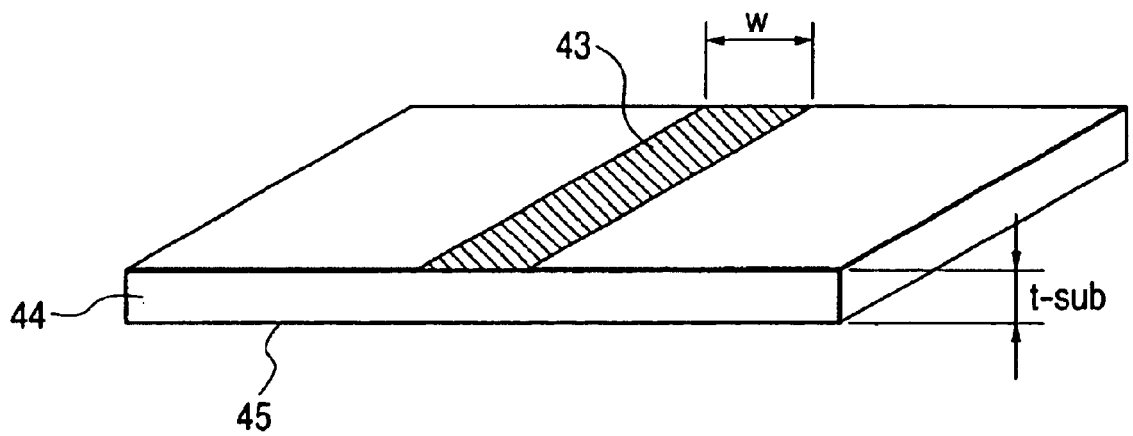
FIG. 9 is a sectional view showing a transmission line formed on a single layer dielectric substrate.
Figure 10:
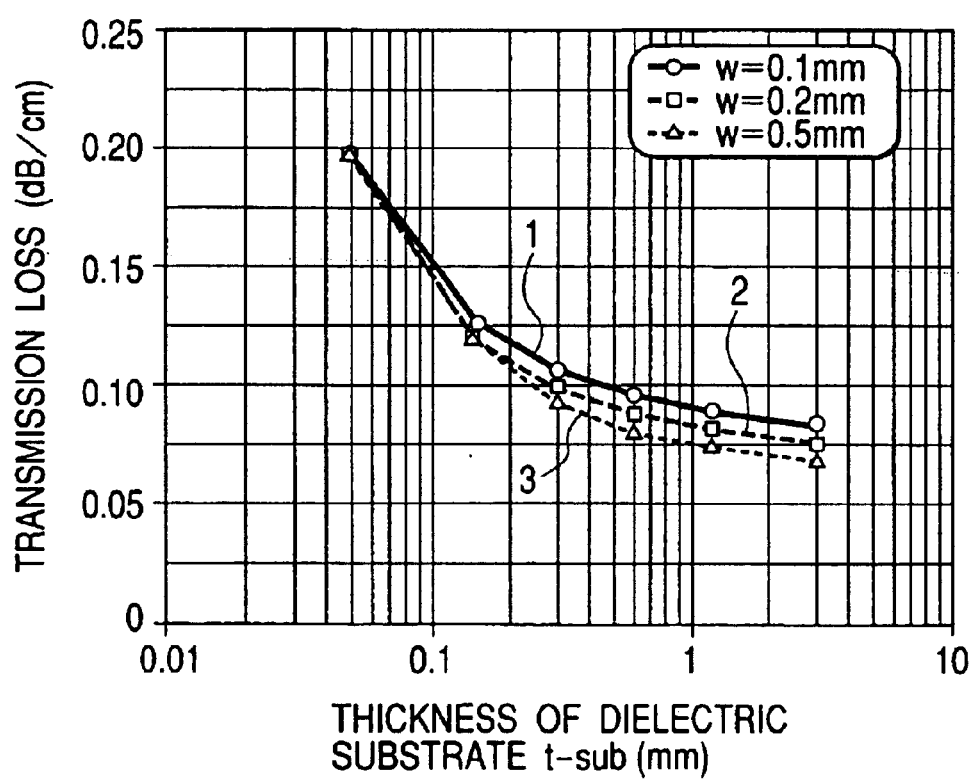
FIG. 10 shows calculated values of the high frequency loss of the transmission line formed on the single layer dielectric substrate in case the thickness of the dielectric substrate is varied.
Figure 11:
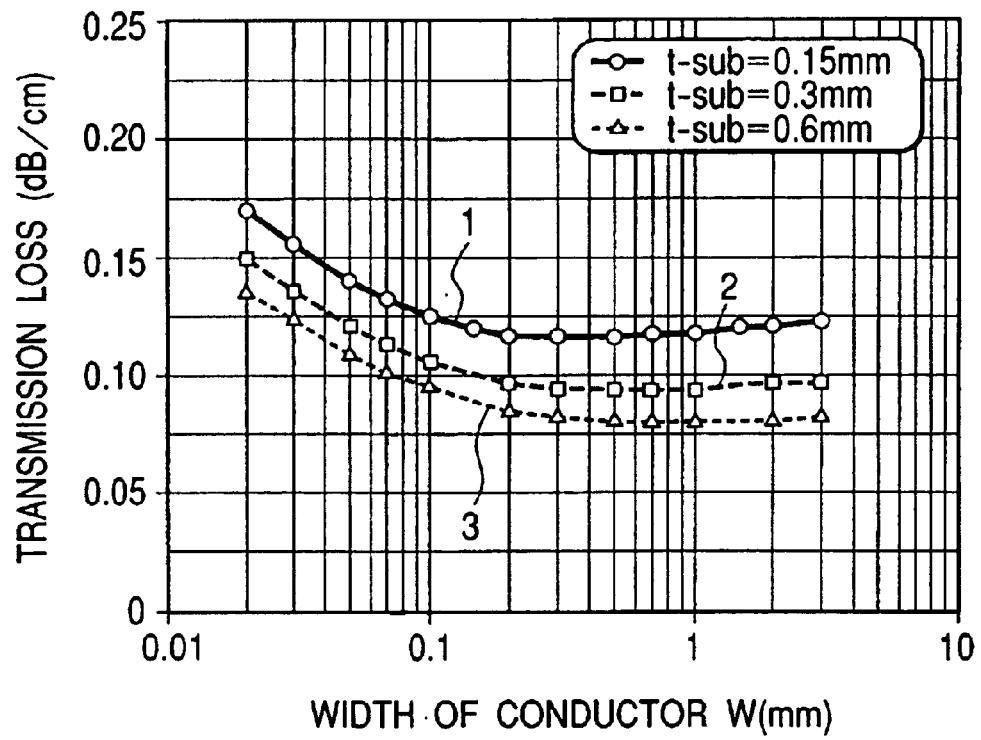
FIG. 11 shows calculated values of the high frequency loss of the transmission line formed on the single layer dielectric substrate in case the width of a conductor is varied.
Figure 12:
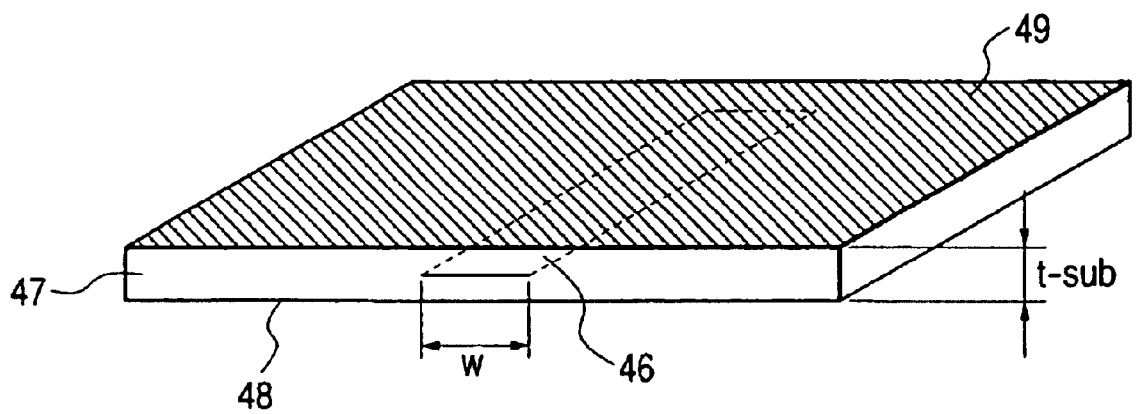
FIG. 12 is a sectional view showing a transmission line formed on a two-layer dielectric substrate.
Figure 13:
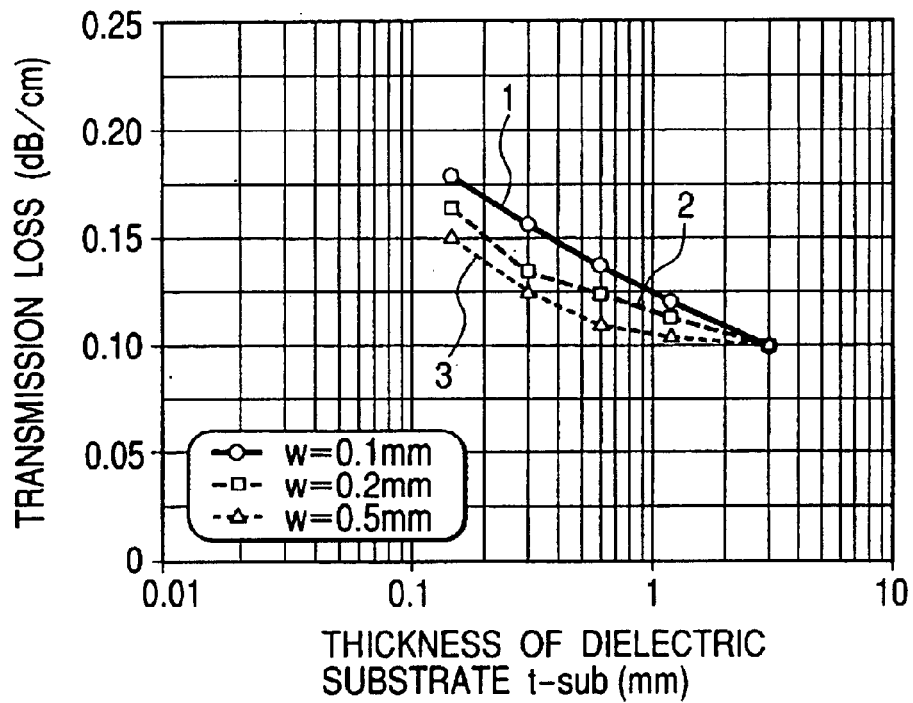
FIG. 13 shows calculated values of the high frequency loss of the transmission line formed on the two-layer dielectric substrate in case the thickness of the dielectric substrate is varied.
Figure 14:
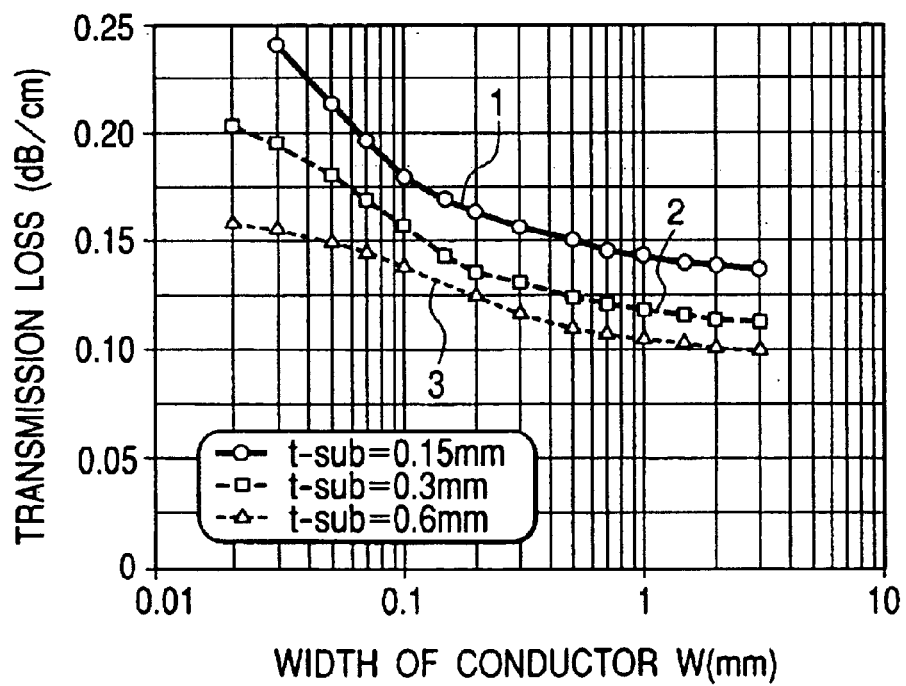
FIG. 14 shows calculated values of the high frequency loss of the transmission line formed on the two-layer dielectric substrate in case the width of a conductor is varied.

FIG. 4 shows the loss of the matching circuit in case the equivalent circuit of the matching circuit on the output side shown in FIG. 3 is composed of a single layer dielectric substrate 44 as shown in FIG. 9, the output impedance of the semiconductor chip 16 including bonding wire is 1 to 100 Ω, load impedance is 50 Ω, the relative inductivity of the dielectric substrate 44 is 8.1, the width of the conductor line 9 formed on the dielectric substrate 44 is 0.3 mm, the dielectric loss tangent tan δ of the dielectric substrate 44 is 0.017, the length of the conductor lines 9a, 9b and 9c and the values of the chip capacitors 10, 11 and 12 are optimized so that they are matched at the frequency of 1.9 GHz. As shown in FIG. 4, curves 1, 2 and 3 show calculated values in case the thickness of the dielectric substrate 44 is respectively 0.15 mm, 0.3 mm and 0.6 mm. As clear from FIG. 4, as the dielectric substrate 44 forming the conductor line 9 becomes thick, the loss of the matching circuit has a tendency to become small. For example, when the output impedance of the semiconductor chip 16 including bonding wire is 10 Ω, the loss of the matching circuit is 0.16 dB in case the thickness of the dielectric substrate 44 is 0.15 mm, however, when the thickness of the dielectric substrate 44 is 0.3 mm, the loss of the matching circuit is 0.13 dB and when the thickness of the dielectric substrate 44 is 0.6 mm, the loss of the matching circuit is reduced up to 0.1 dB.

Second Embodiment

Figure 5A:
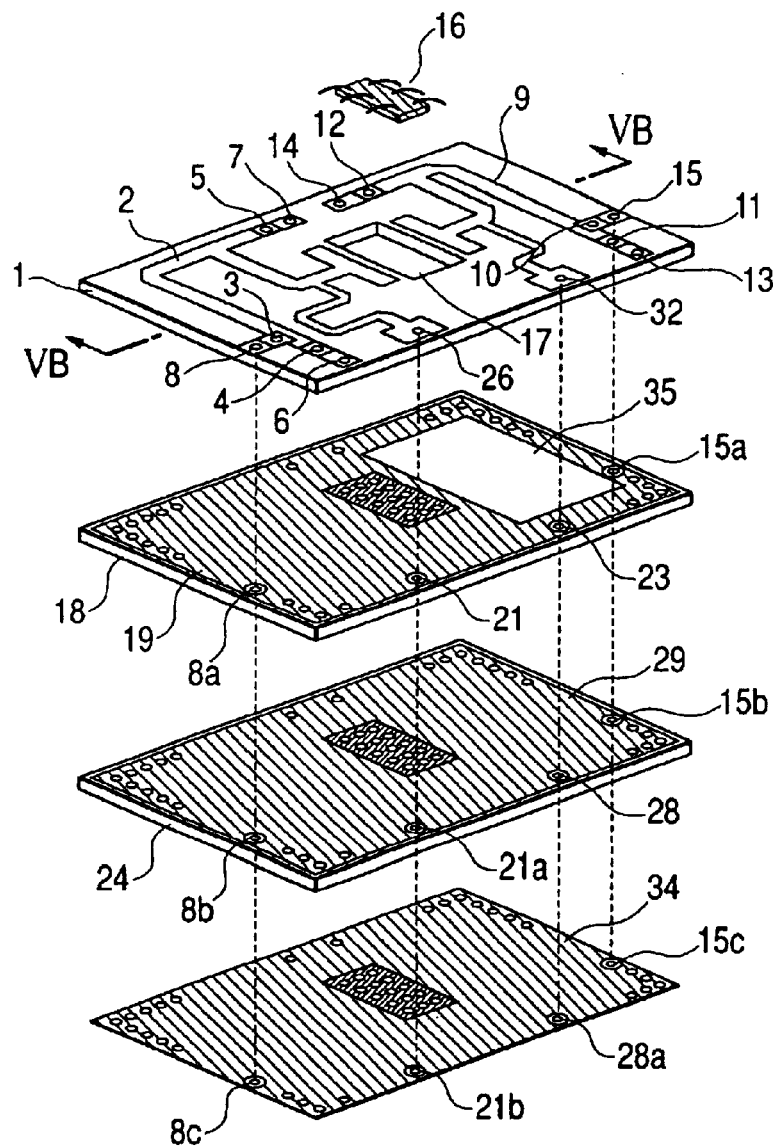
FIGS. 5A and 5B are an exploded view and a sectional view showing a high frequency circuit module equivalent to a second embodiment of the invention.
Figure 5B:
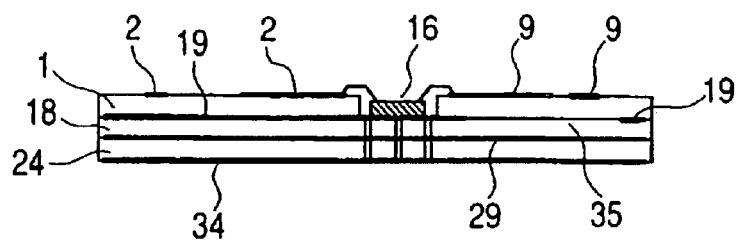

FIG. 5A is an exploded view showing a high frequency circuit module equivalent to a second embodiment and FIG. 5B is a sectional view viewed along a line VB—VB in case the high frequency circuit module shown in FIG. 5A is assembled. A matching circuit on the input side composed of a conductor line 2 and chip capacitors 3, 4 and 5 is formed on a first-layer dielectric substrate 1, the chip capacitor 3 is connected to an input terminal 8, the chip capacitor 4 is connected to an earth terminal 6 and the chip capacitor 5 is connected to an earth terminal 7. The input terminal 8 is connected to a terminal 8c provided by removing ground metal formed on the reverse side of a third-layer dielectric substrate 24 via a through-hole 8a provided to a second-layer dielectric substrate 18 and a through-hole 8b provided to the third-layer dielectric substrate 24. Further, a matching circuit on the output side composed of a conductor line 9 and chip capacitors 10, 11 and 12 is formed, the chip capacitor 10 is connected to an output terminal 15, the chip capacitor 11 is connected to an earth terminal 13 and the chip capacitor 12 is connected to an earth terminal 14. The output terminal 15 is connected to a terminal 15c provided by removing ground metal formed on the reverse side of the third-layer dielectric substrate 24 via a through-hole 15a provided to the second-layer dielectric substrate 18 and a through-hole 15b provided to the third-layer dielectric substrate 24.

To bond a semiconductor chip 16 to ground metal 19 provided on the surface of the second-layer dielectric substrate 18, a dielectric substance is removed and a hole 17 that pierces the dielectric substrate is provided to the first-layer dielectric substrate 1. The conductor line 2 provided on the surface of the first-layer dielectric substrate 1 is connected to a terminal 26. Also, the conductor line 9 provided on the surface of the first-layer dielectric substrate 1 is connected to a terminal 32.

The semiconductor chip 16 is bonded to the conductor lines 2 and 9 provided on the surface of the first-layer dielectric substrate 1. The ground metal 19 formed on the surface of the second-layer dielectric substrate 18 to which the semiconductor chip 16 is bonded is connected to ground metal 29 provided on the surface of the third-layer dielectric substrate 24 and ground metal 34 formed on the reverse side of the third-layer dielectric substrate 24 via through-holes in a part where the semiconductor chip 16 is bonded.

A part 35 of the ground metal 19 formed on the surface of the second-layer dielectric substrate 18 is removed so that a part opposite to the conductor line 9 of the matching circuit on the output side formed on the surface of the first-layer dielectric substrate 1 is included. The ground metal 19 is connected to the ground metal 29 and 34 respectively formed on the surface and on the reverse side of the third-layer dielectric substrate 24 via through-holes in the periphery of the dielectric substrate.

Third Embodiment

Figure 6A:
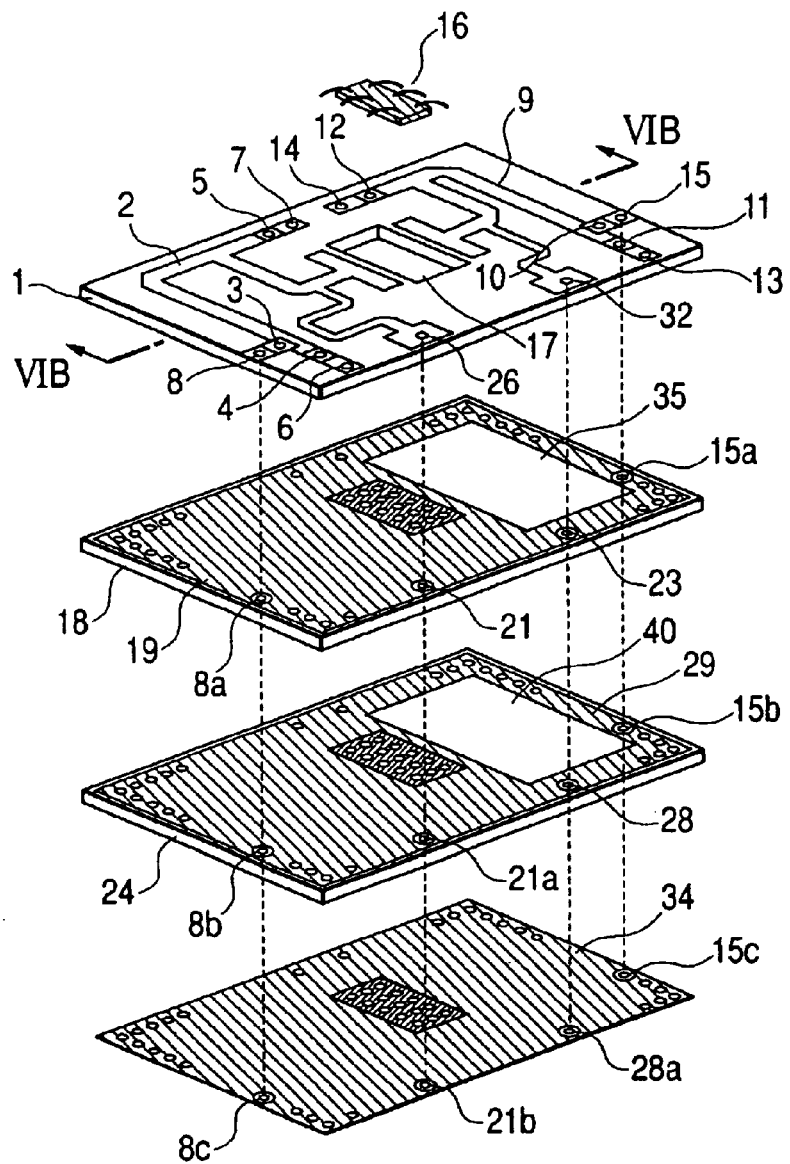
FIGS. 6A and 6B are an exploded view and a sectional view showing a high frequency circuit module equivalent to a third embodiment of the invention.
Figure 6B:
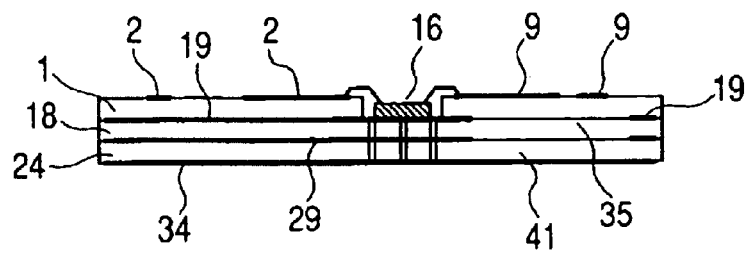

FIG. 6A is an exploded view showing a high frequency circuit module equivalent to a third embodiment and FIG. 6B is a sectional view viewed along a line VIB—VIB in case the high frequency circuit module shown in FIG. 6A is assembled. A matching circuit on the input side composed of a conductor line 2 and chip capacitors 3, 4 and 5 is formed on the surface of a first-layer dielectric substrate 1, the chip capacitor 3 is connected to an input terminal 8, the chip capacitor 4 is connected to an earth terminal 6 and the chip capacitor 5 is connected to an earth terminal 7. The input terminal 8 is connected to a terminal 8c provided by removing ground metal formed on the reverse side of a third-layer dielectric substrate 24 via a through-hole 8a provided to a second-layer dielectric substrate 18 and a through-hole 8b provided to the third-layer dielectric substrate 24. Further, a matching circuit on the output side composed of a conductor line 9 and chip capacitors 10, 11 and 12 is formed, the chip capacitor 10 is connected to an output terminal 15, the chip capacitor 11 is connected to an earth terminal 13 and the chip capacitor 12 is connected to an earth terminal 14. The output terminal 15 is connected to a terminal 15c provided by removing ground metal 34 formed on the reverse side of the third-layer dielectric substrate 24 via a through-hole 15a provided to the second-layer dielectric substrate 18 and a through-hole 15b provided to the third-layer dielectric substrate 24.

To bond a semiconductor chip 16 to ground metal 19 provided on the surface of the second-layer dielectric substrate 18, a dielectric substance is removed and a hole 17 that pierces the dielectric substrate is provided to the first-layer dielectric substrate 1. The conductor line 2 provided on the first-layer dielectric substrate 1 is connected to a terminal 26. Also, the conductor line 9 provided on the surface of the first-layer dielectric substrate 1 is connected to a terminal 32.

The semiconductor chip 16 is bonded to the conductor lines 2 and 9 provided on the surface of the first-layer dielectric substrate 1. The ground metal 19 formed on the surface of the second-layer dielectric substrate 18 to which the semiconductor chip 16 is bonded is connected to ground metal 29 and 34 provided on the surface and on the reverse side of the third-layer dielectric substrate 24 via through-holes in a part where the semiconductor chip 16 is bonded.

A part 35 of the ground metal 19 formed on the surface of the second-layer dielectric substrate 18 is removed so that a part opposite to the conductor line 9 of the matching circuit on the output side formed on the surface of the first-layer dielectric substrate 1 is included. Further, a part 40 of the ground metal 29 on the surface of the third-layer dielectric substrate 24 is removed so that a part opposite to the conductor line 9 is included. The ground metal 19 and 29 are connected to each other via through-holes in the periphery of the dielectric substrate and is also connected to the ground metal 34 formed on the reverse side of the third-layer dielectric substrate 24.

Fourth Embodiment

Figure 7A:
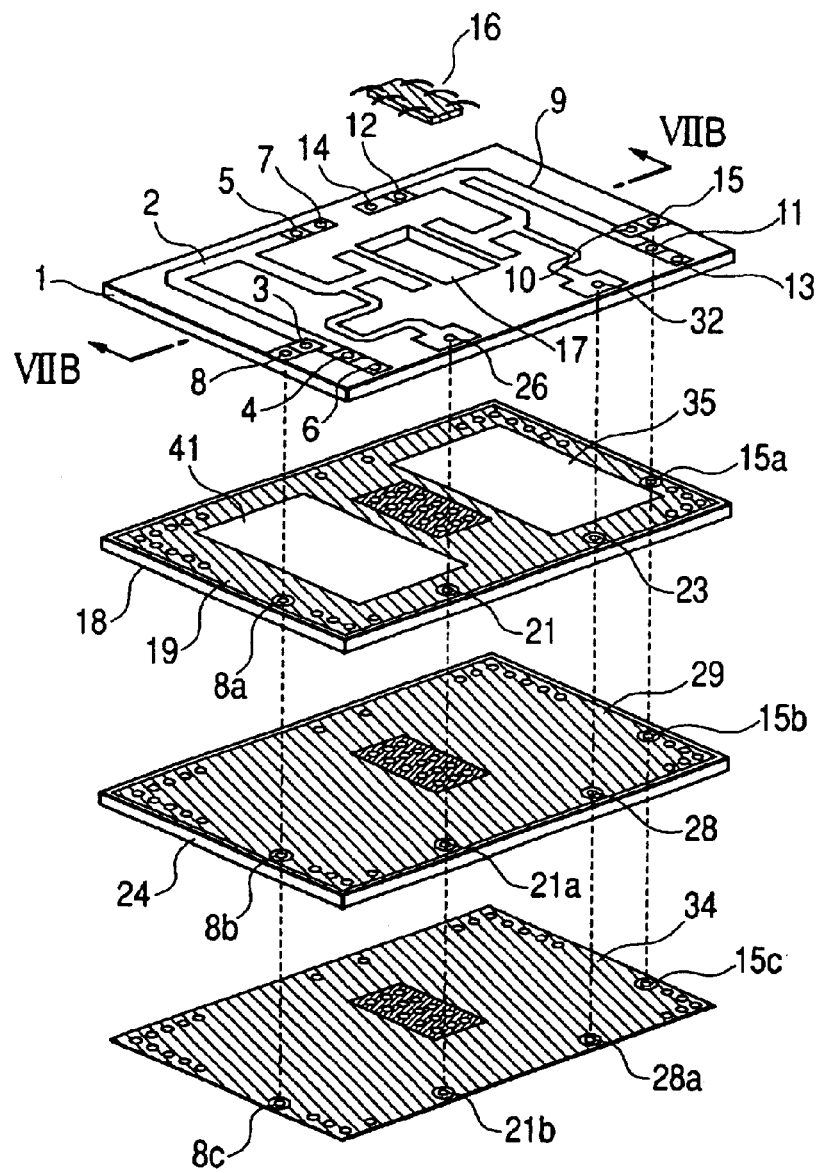
FIGS. 7A and 7B are an exploded view and a sectional view showing a high frequency circuit module equivalent to a fourth embodiment of the invention.
Figure 7B:
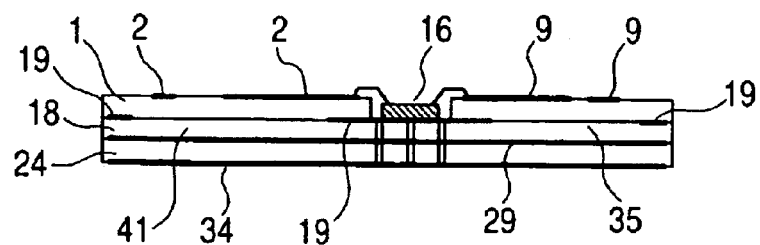

FIG. 7A is an exploded view showing a high frequency circuit module equivalent to a fourth embodiment and FIG. 7B is a sectional view viewed along a line VIIB—VIIB in case the high frequency circuit module shown in FIG. 7A is assembled. A matching circuit on the input side composed of a conductor line 2 and chip capacitors 3, 4 and 5 is formed on the surface of a first-layer dielectric substrate 1, the chip capacitor 3 is connected to an input terminal 8, the chip capacitor 4 is connected to an earth terminal 6 and the chip capacitor 5 is connected to an earth terminal 7. The input terminal 8 is connected to a terminal 8c provided by removing ground metal formed on the reverse side of a third-layer dielectric substrate 24 via a through-hole 8a provided to a second-layer dielectric substrate 18 and a through-hole 8b provided to the third-layer dielectric substrate 24. Further, a matching circuit on the output side composed of a conductor line 9 and chip capacitors 10, 11 and 12 is formed, the chip capacitor 10 is connected to an output terminal 15, the chip capacitor 11 is connected to an earth terminal 13 and the chip capacitor 12 is connected to an earth terminal 14. The output terminal 15 is connected to a terminal 15c provided by removing ground metal formed on the reverse side of the third-layer dielectric substrate 24 via a through-hole 15a provided to the second-layer dielectric substrate 18 and a through-hole 15b provided to the third-layer dielectric substrate 24.

To bond a semiconductor chip 16 to ground metal 19 provided on the surface of the second-layer dielectric substrate 18, a dielectric substance is removed and a hole 17 that pierces the dielectric substrate is provided to the first-layer dielectric substrate 1. The conductor line 2 provided on the first-layer dielectric substrate 1 is connected to a terminal 26. Also, the conductor line 9 provided on the surface of the first-layer dielectric substrate 1 is connected to a terminal 32.

The semiconductor chip 16 is bonded to the conductor lines 2 and 9 provided on the surface of the first-layer dielectric substrate 1. The ground metal 19 formed on the surface of the second-layer dielectric substrate 18 to which the semiconductor chip 16 is bonded is connected to ground metal 29 and 34 provided on the surface and on the reverse side of the third-layer dielectric substrate 24 via through-holes in a part where the semiconductor chip 16 is bonded.

A part 41 of the ground metal 19 on the surface of the second-layer dielectric substrate 18 is removed so that a part opposite to the conductor line 2 of the matching circuit on the input side on the surface of the first-layer dielectric substrate 1 is included. Further, a part 35 of the ground metal 19 on the surface of the second-layer dielectric substrate 18 is removed so that a part opposite to the conductor line 9 of the matching circuit on the output side is included. The dielectric substrate in the removed part can be thicker than the first-layer dielectric substrate 1, the second-layer dielectric substrate 18 or the third-layer dielectric substrate 24. The ground metal 19 is connected to the ground metal 29 and 34 formed on the surface and on the reverse side of the third-layer dielectric substrate 24 via through-holes in the periphery of the dielectric substrate.

Fifth Embodiment

Figure 8A:
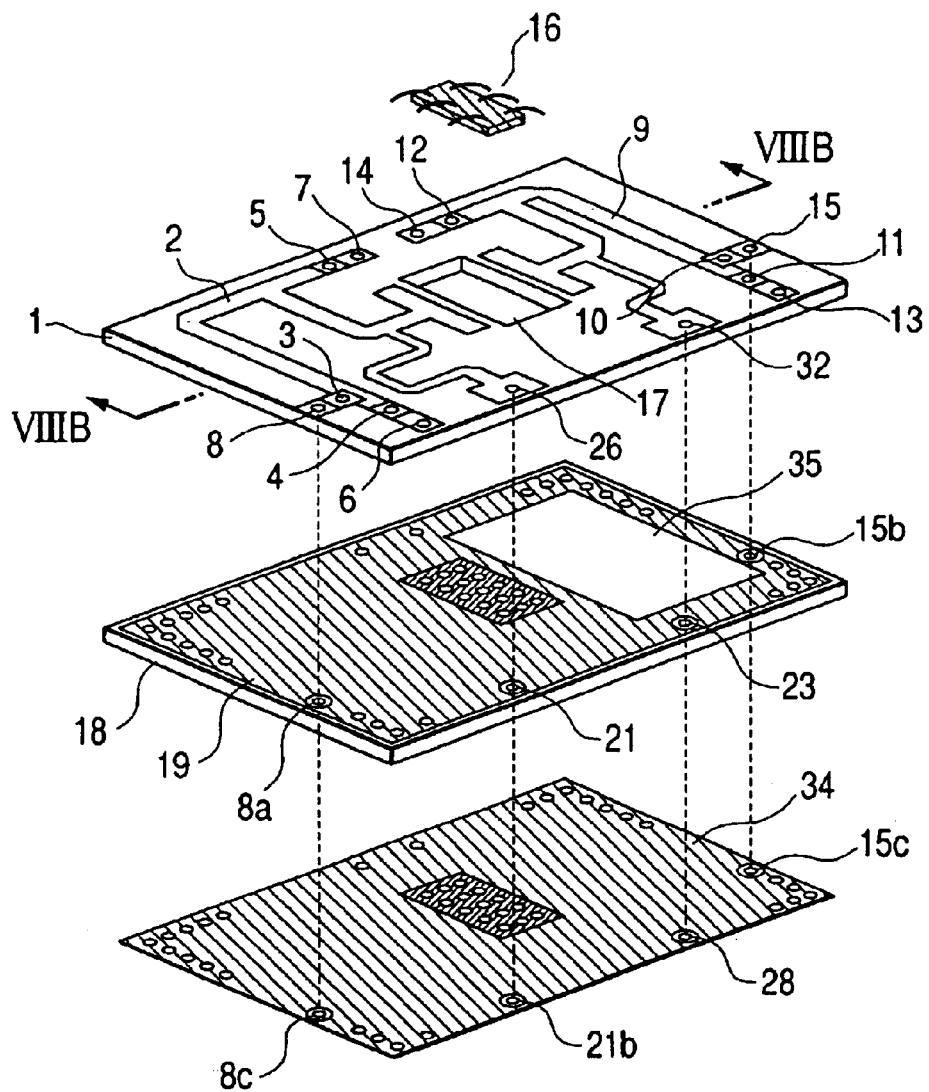
FIGS. 8 are an exploded view and a sectional view showing a high frequency circuit module equivalent to a fifth embodiment of the invention.
Figure 8B:
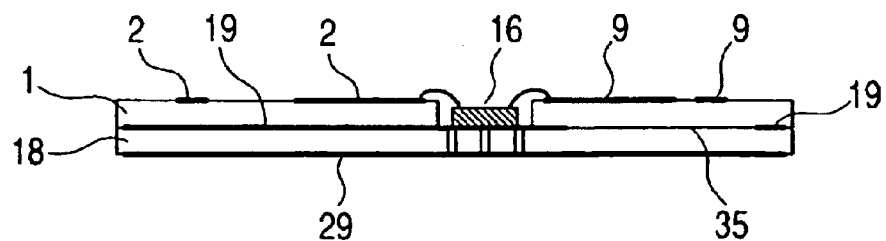

FIG. 8A is an exploded view showing a high frequency circuit module equivalent to a fifth embodiment and FIG. 8B is a sectional view viewed along a line VIIIB—VIIIB in case the high frequency circuit module shown in FIG. 8A is assembled. A matching circuit on the input side composed of a conductor line 2 and chip capacitors 3, 4 and 5 is formed on the surface of a first-layer dielectric substrate 1, the chip capacitor 3 is connected to an input terminal 8, the chip capacitor 4 is connected to an earth terminal 6 and the chip capacitor 5 is connected to an earth terminal 7. The input terminal 8 is connected to a terminal 8c provided by removing ground metal formed on the reverse side of a second-layer dielectric substrate 18 via a through-hole 8a provided to the second-layer dielectric substrate 18. Further, a matching circuit on the output side composed of a conductor line 9 and chip capacitors 10, 11 and 12 is formed, the chip capacitor 10 is connected to an output terminal 15, the chip capacitor 11 is connected to an earth terminal 13 and the chip capacitor 12 is connected to an earth terminal 14. The output terminal 15 is connected to a terminal 15c provided by removing ground metal formed on the reverse side of the second-layer dielectric substrate 18 via a through-hole 15b provided to the second-layer dielectric substrate 18.

To bond a semiconductor chip 16 to ground metal 19 provided on the surface of the second-layer dielectric substrate 18, a dielectric substance is removed and a hole 17 that pierces the dielectric substrate is provided to the first-layer dielectric substrate 1. The conductor line 2 provided on the surface of the first-layer dielectric substrate 1 is connected to a terminal 26. Also, the conductor line 9 provided on the surface of the first-layer dielectric substrate 1 is connected to a terminal 32.

The semiconductor chip 16 is bonded to the conductor lines 2 and 9 provided on the surface of the first-layer dielectric substrate 1. The ground metal 19 formed on the surface of the second-layer dielectric substrate 18 to which the semiconductor chip 16 is bonded is connected to ground metal 29 provided on the reverse side of the second-layer dielectric substrate 18 via through-holes in a part where the semiconductor chip 16 is bonded.

A part 35 of the ground metal 19 on the surface of the second-layer dielectric substrate 18 is removed so that a part opposite to the conductor line 9 of the matching circuit on the output side on the surface of the first-layer dielectric substrate 1 is included. The dielectric substrate in the removed part can be thicker than the first-layer dielectric substrate 1 or the second-layer dielectric substrate 18. The ground metal 19 is connected to the ground metal 29 formed on the reverse side of the second-layer dielectric substrate 18 via through-holes in the periphery of the dielectric substrate.

Sixth Embodiment

Figure 15:
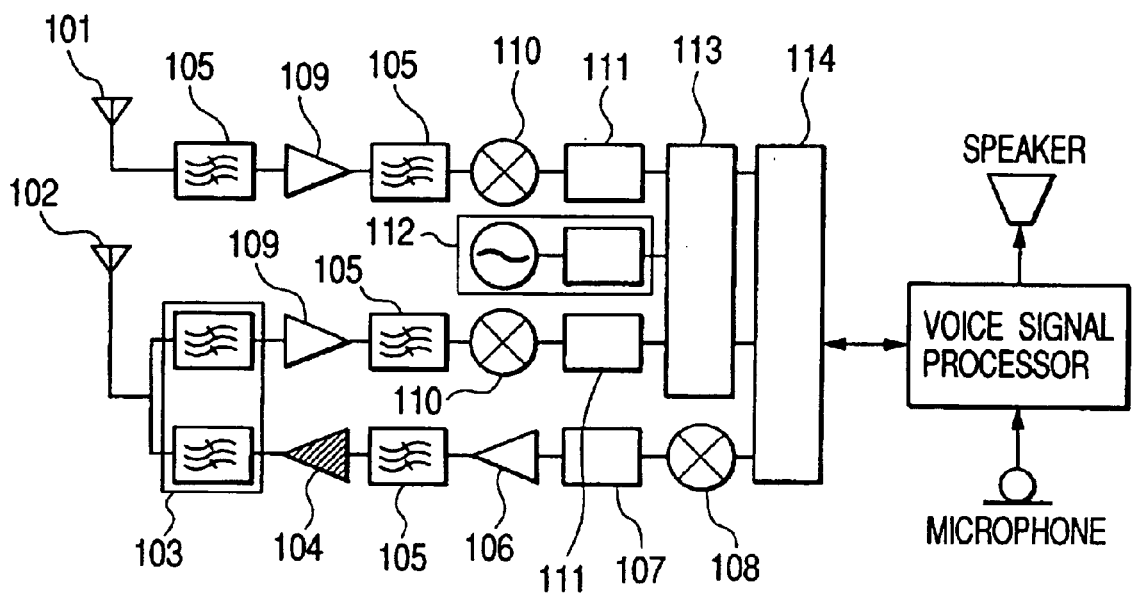
FIG. 15 is a block diagram showing a high frequency unit of a mobile wireless terminal.
Figure 16:
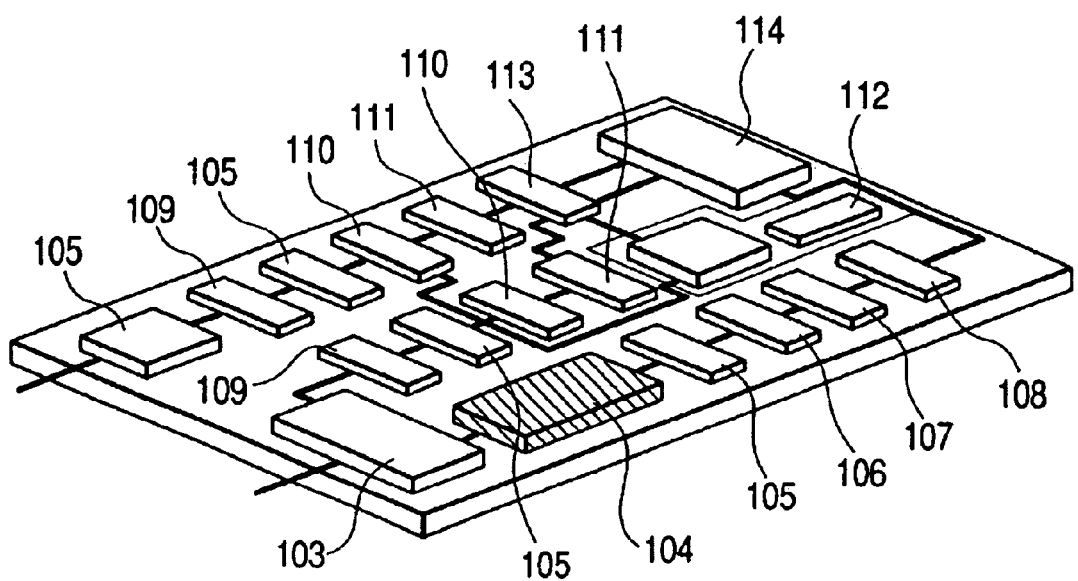
FIG. 16 is a part layout drawing showing the high frequency unit of the mobile wireless terminal.

FIG. 15 is a block diagram showing a mobile wireless terminal equivalent to one embodiment of a communication device according to the invention. FIG. 16 is a part layout drawing showing a high frequency unit of the mobile wireless terminal shown in FIG. 15. A signal at the transmitting end is output from an antenna-2 102 via a modulator 108, a burst switch 107, a driving amplifier 106, a filter 105, a power amplifier 104 and a duplexer 103. For a signal at the receiving end, a diversity system in which a case that a signal is received from an antenna-1 101 and is transmitted via a low noise amplifier 109, a filter 105, a frequency converter 110 and an IF amplifier 111 and a case that a signal is received from the antenna-2 102 and is transmitted via a low noise amplifier 109, a filter 105, a frequency converter 110 and an IF amplifier 111 are compared, a received signal is processed in a demodulation unit 113 and reaches a base band unit 114 is adopted. A reference number 112 denotes a frequency synthesizer.

The high frequency circuit module described in any of the first to fifth embodiments is used for the power amplifier 104 and a low noise amplifier 109. For the power amplifier 104, the high frequency circuit module that the dielectric substrate between the conductor line of the matching circuit on the input side and the ground metal is also composed of two or more layers is used in addition to the high frequency circuit module that the dielectric substrate between the conductor line of the matching circuit on the output side and the ground metal is composed of two or more layers.

For the low noise amplifier 109, the high frequency circuit module that the dielectric substrate between the conductor line of the matching circuit on the output side and the ground metal is also composed of two or more layers is used in addition to the high frequency circuit module that the dielectric substrate between the conductor line of the matching circuit on the input side and the ground metal is composed of two or more layers. The mobile wireless terminal can be miniaturized by using these high frequency circuit modules.

Various other modifications, alternative, constructions and equivalents may be employed without departing from the true spirit scope off the invention,. as exemplified in foregoing description and defined in the following claims.

What is claimed is:

1. A high frequency circuit module provided with a first dielectric substrate on which a semiconductor element and matching circuits on the input side and on the output side respectively of the semiconductor element respectively formed, a first ground metal plate, and one or more second dielectric substrates located between said first dielectric substrate and the first ground metal, wherein:

a second ground metal is provided on the surface of each of the second dielectric substrates, and the second ground metal provided on the surface of at least one of the second dielectric substrates being adjacent to the first dielectric substrate is formed in the shape in which a part of the second ground metal opposite to the transmission line of said matching circuit on the output side is removed while maintaining the dielectric substrate adjacent to the part of the second ground metal that is removed.

2. A high frequency circuit module according to claim 1, wherein:

said second ground metal is formed in the shape in which a part opposite to said transmission line of said matching circuit on the input side is removed while maintaining the dielectric substrate adjacent to the part removed.

3. A communication device, wherein:

the high frequency circuit module according to claim 2 is used for the power amplifier at the transmitting end.

4. A communication device, wherein:

the high frequency circuit module according to claim 1 is used for the power amplifier at the transmitting end.

5. A high frequency circuit module provided with a first dielectric substrate on which a semiconductor element and matching circuits on the input side and on the output side respectively of the semiconductor element respectively formed, a first ground metal plate, and one or more second dielectric substrates located between said first dielectric substrate and the first ground metal, wherein:

a second ground metal is provided on the surface of each of the second dielectric substrates, and the second ground metal provided on the surface of at least one of the second dielectric substrates being adjacent to the first dielectric substrate is formed in the shape in which a part of the second ground metal opposite to the transmission line of said matching circuit on the input side is removed while maintaining the dielectric substrate adjacent to the part of the second ground metal that is removed.

6. A high frequency circuit module according to claim 5, wherein:

the second ground metal is formed in the shape in which a part opposite to said transmission line of said matching circuit on the output side is removed while maintaining the dielectric substrate adjacent to the part removed.

7. A communication device, wherein:

the high frequency circuit module according to claim 6 is used for the low noise amplifier at the receiving end.

8. A communication device, wherein:

the high frequency circuit module according to claim 5 is used for the low noise amplifier at the receiving end.

9. A high frequency circuit module having a first dielectric substrate on which a semiconductor element, an input-side matching circuit and output-side matching circuit are formed;

a first ground metal plate;

a second dielectric substrate located between said first dielectric substrate and said first ground metal; and a second ground metal provided on the surface of said second dielectric substrate such that said second ground metal is located between said first dielectric substrate and said second dielectric substrate and is adjacent to said first dielectric substrate, wherein a portion of said second ground metal is removed from the surface of said second dielectric substrate, said portion facing said output-side matching circuit provided on said first dielectric substrate such that said output side matching circuit faces said second dielectric substrate.

10. A high frequency circuit module as claimed in claim 9, wherein said second ground metal is formed such that said portion of said second ground metal is removed while maintaining the second dielectric substrate below said portion of said second ground metal that is removed.

11. A high frequency circuit module as claimed in claim 10, further comprising at least one additional dielectric substrate located between said second dielectric substrate and said first ground metal.

12. A high frequency circuit module as claimed in claim 9, further comprising at least one additional dielectric substrate located between said second dielectric substrate and said first ground metal.

13. A high frequency circuit module as claimed in claim 9, wherein said portion of said second ground metal that is removed faces a transmission line portion of said output-side matching circuit.

14. A high frequency circuit module as claimed in claim 9, wherein another portion of said second ground metal is removed from the surface of said second dielectric substrate, said portion facing said input-side matching circuit.

15. A high frequency circuit module as claimed in claim 14, wherein said second ground metal is formed such that said another portion of said second ground metal is removed while maintaining the second dielectric substrate below said another portion of said second ground metal that is removed.

16. A high frequency circuit module as claimed in claim 15, further comprising at least one additional dielectric substrate located between said second dielectric substrate and said first ground metal.

17. A high frequency circuit module as claimed in claim 14, further comprising at least one additional dielectric substrate located between said second dielectric substrate and said first ground metal.

18. A high frequency circuit module as claimed in claim 14, wherein said another portion of said second ground metal that is removed faces a transmission line portion of said input-side matching circuit.

* * * * *